US008188789B2

(12) United States Patent
Woo et al.

(10) Patent No.: US 8,188,789 B2
(45) Date of Patent: May 29, 2012

(54) APPARATUS FOR IMPROVING PERFORMANCE AT LOW POWER REGION IN A DOHERTY AMPLIFIER

(75) Inventors: Young-Yoon Woo, Hwaseong-si (KR);
Han-Seok Kim, Seoul (KR);
Dong-Geun Lee, Hwaseong-si (KR);
Bum-Man Kim, Pohang-si (KR);
Jung-Hwan Moon, Pohang-si (KR)

(73) Assignees: Samsung Electronics Co., Ltd.,
Suwon-si (KR); Postech Academy-Industry Foundation,
Gyeongbuk (KR)

( * ) Notice: Subject to any disclaimer, the term of this patent is extended or adjusted under 35 U.S.C. 154(b) by 0 days.

(21) Appl. No.: 13/035,086

(22) Filed: Feb. 25, 2011

(65) Prior Publication Data

US 2011/0204974 A1    Aug. 25, 2011

(30) Foreign Application Priority Data

Feb. 25, 2010    (KR) .................. 10-2010-0016997

(51) Int. Cl.
*H03F 3/68* (2006.01)

(52) U.S. Cl. .................. 330/124 R; 330/295

(58) Field of Classification Search .............. 330/124 R, 330/295, 286, 53
See application file for complete search history.

(56) References Cited

U.S. PATENT DOCUMENTS

| 6,791,417 | B2 * | 9/2004 | Pengelly et al. | 330/295 |
| 7,336,125 | B2 * | 2/2008 | Kyu et al. | 330/51 |
| 7,663,435 | B2 * | 2/2010 | Kim et al. | 330/124 R |
| 7,936,213 | B2 * | 5/2011 | Shin et al. | 330/124 R |
| 8,035,444 | B2 * | 10/2011 | Okubo et al. | 330/124 R |
| 2011/0140775 | A1 * | 6/2011 | Hong et al. | 330/124 R |

* cited by examiner

*Primary Examiner* — Patricia Nguyen

(57) ABSTRACT

A method and apparatus improve the performance of a carrier amplifier in a Doherty amplifier. The Doherty amplifier includes a power divider, a carrier amplifier, at least one peaking amplifier, offset lines, and a Doherty circuit. The power divider provides a power signal to each of the carrier amplifier and the at least one peaking amplifier. The carrier amplifier amplifies power of a signal inputted from the power divider. The at least one peaking amplifier amplifies power of a signal inputted from the power divider. The offset lines control a load impedance when the at least one peaking amplifier does not operate. When the at least one peaking amplifier does not operate, the Doherty circuit generates the load impedance of the carrier amplifier that is larger than twice a load impedance at the maximum output power of the carrier amplifier.

20 Claims, 12 Drawing Sheets

APPARATUS FOR IMPROVING PERFORMANCE AT LOW POWER REGION IN A DOHERTY AMPLIFIER

CROSS-REFERENCE TO RELATED APPLICATION(S) AND CLAIM OF PRIORITY

The present application is related to and claims the benefit under 35 U.S.C. §119(a) to a Korean patent application filed in the Korean Intellectual Property Office on Feb. 25, 2010 and assigned Serial No. 10-2010-0016997, the entire disclosure of which is hereby incorporated by reference.

TECHNICAL FIELD OF THE INVENTION

The present invention relates to a Doherty amplifier. More particularly, the present invention relates to an apparatus for improving performance at a low power region at which a peaking amplifier does not operate in a Doherty amplifier.

BACKGROUND OF THE INVENTION

In general, a Doherty amplifier has a structure of connecting a carrier amplifier and a peaking amplifier in parallel using a quarter-wave (λ/4) transformer line. With an increase of a power level, an amount of current supplied to a load by the peaking amplifier increases, and performance increases through the control of the load impedance of each of the carrier amplifier and the peaking amplifier.

A microwave Doherty amplifier was proposed by 'W. H. Doherty' in 1936. At the beginning, the microwave Doherty amplifier was devised as an Amplitude Modulation (AM) transmitter of a broadcasting device that makes use of a Low Frequency (LF) vacuum tube or a Medium Frequency (MF) vacuum tube. Since then, there have been several proposals for realization of a Doherty amplifier using a solid-state device not a vacuum tube, and many studies have been made for substantial realization.

A power amplifier through asymmetric power coupling called the Doherty amplifier achieved high performance and high linearity. Particularly, there was much performance improvement for a Doherty amplifier of a Base Station (BS) and a Mobile Station (MS) of a mobile communication system. A Doherty amplifier at a high frequency band is composed of an input power divider, a transmission line for synchronizing a phase between carrier/peaking amplifiers, the carrier/peaking amplifiers realized to output the same value while providing the maximum output in one amplifier by constructing an input/output matching circuit of each amplifier, and a quarter-wave transmission line for offset line and Doherty operation for, when the peaking amplifier does not operate, increasing an output impedance and inducing the occurrence of a suitable load modulation phenomenon.

The above construction is to enable matching of not only a real part but an imaginary part by disposing a matching circuit in an output unit of a transistor and disposing an offset line after the matching circuit, thereby obtaining the maximum output of an amplifier and simultaneously inducing a Doherty operation. Also, studies were made for an N-way Doherty amplifier that is a structure capable of further generalizing a Doherty amplifier and optimizing performance and linearity. In addition, studies were made for an N-stage Doherty power amplification scheme of gradually inducing high performance from a power level lower than that of a general Doherty amplifier. Alternatively, a Doherty amplifier using an envelope tracking device has been realized to solve a problem of failing to provide the maximum output due to a low bias of a peaking amplifier. Studies were conducted for a Doherty amplifier using asymmetric power driving that changes input power dividing.

As described above, various Doherty power amplification technologies were developed. But as a BS and an MS of a mobile communication system are gradually miniaturized and the necessity of price reduction increases, there is a demand for higher performance than that of a conventional Doherty amplifier, and particularly, high performance at average output power at the time of applying a modulation signal. FIG. 1 illustrates a performance characteristic of a class B amplifier, and a Doherty amplifier, and a schematic performance characteristic of a Doherty amplifier whose actual realization is easy in realizing an ideal Doherty amplifier in view of performance, and a probability density function and power generation function of World Interoperability for Microwave Access (WiMAX) for wireless communication in a BS with a Peak to Average Power Ratio (PAPR) of 7.8 dB. In FIG. 1, the Doherty type I illustrates performance decreases by unsuitable load modulation at maximum power regions of a carrier amplifier and a peaking amplifier. Also, the Doherty type II illustrates performance decreases at a region backed off by the effects of a leakage of carrier output power capable of occurring because the output impedance of a peaking amplifier is less, or a performance decrease occurring because a carrier amplifier does not perform sufficient saturation operation due to On-resistance. When a modulation signal is applied regarding each performance characteristic, performance at an average power region backed off as much as a PAPR can be determined according to Equation 1 below. The determined result is given according to Table 1 below.

$$\eta_{avg} = \frac{\int_0^{P_{out,max}} p \cdot d \cdot f(P_{out}) P_{out} dP_{out}}{\int_0^{P_{out,max}} p \cdot d \cdot f(P_{out}) P_{dc}(P_{out}) dP_{out}} \quad \text{[Eqn. 1]}$$

In Equation 1 above, the '$\eta_{avg}$' represents an average performance, the '$P_{out,max}$' represents the maximum output power, the '$P_{out}$' represents output power, and the 'pdf($P_{out}$)' represents a probability distribution function of the output power.

TABLE 1

|  | Class B | Ideal Doherty | Type I | Type II |
| --- | --- | --- | --- | --- |
| Performance | 31.6% | 61.6% | 59.4% | 56.3% |

As shown in Table 1, it can be appreciated that the Doherty type I has performance almost similar to that of the ideal Doherty amplifier and, through this, performance at a back-off region has great effect on the whole performance characteristic compared to performance at a maximum power region.

SUMMARY OF THE INVENTION

To address the above-discussed deficiencies of the prior art, it is a primary aspect of the present invention to provide an apparatus for improving the performance of a carrier amplifier in a Doherty amplifier.

Another aspect of the present invention is to provide an apparatus for improving performance at a low power region at which a peaking amplifier does not operate, in a Doherty amplifier.

A further aspect of the present invention is to provide an apparatus for maximizing the performance of a carrier amplifier at a low power region and improving performance for a modulation signal with a Peak to Average Power Ratio (PAPR) in a Doherty amplifier.

The above aspects are achieved by providing an apparatus for improving performance at a low power region in a Doherty amplifier.

According to one aspect of the present invention, a Doherty amplifier apparatus is provided. The apparatus includes a power divider, a carrier amplifier, at least one peaking amplifier, offset lines, and a Doherty circuit. The power divider provides a power signal to each of the carrier amplifier and the at least one peaking amplifier. The carrier amplifier amplifies power of a signal inputted from the power divider. The at least one peaking amplifier amplifies power of a signal inputted from the power divider. The offset lines control a load impedance when the at least one peaking amplifier does not operate. When the at least one peaking amplifier does not operate, the Doherty circuit generates the load impedance of the carrier amplifier that is larger than twice a load impedance at the maximum output power of the carrier amplifier.

According to another aspect of the present invention, an operation method of a Doherty amplifier is provided. The method includes providing a power signal to each of a carrier amplifier and at least one peaking amplifier. When the at least one peaking amplifier does not operate, a load impedance of the carrier amplifier that is larger than twice a load impedance at the maximum output power of the carrier amplifier is generated at a Doherty circuit. And power of a signal inputted from the power divider is amplified through the carrier amplifier.

According to yet another aspect of the present invention, an apparatus is provided. The apparatus includes a power divider for dividing an input signal to a plurality of power signals. A carrier amplifier amplifies one of the plurality of power signals from the power divider. The apparatus also includes at least one peaking amplifier. Each peaking amplifier amplifies one of the remaining power signals from the power divider. The number of the plurality of power signals corresponds to the total count of the carrier amplifier and the at least one peaking amplifier. A plurality of offset lines allows load modulation. A first of the plurality of offset lines is coupled to an output of the carrier amplifier, and each of the remaining offset lines is coupled to an output of an output of a corresponding peaking amplifier. A Doherty circuit generates a load impedance of the carrier amplifier that is larger than twice a load impedance at the maximum output power of the carrier amplifier when the at least one peaking amplifier does not operate.

Other aspects, advantages, and salient features of the invention will become apparent to those skilled in the art from the following detailed description, which, taken in conjunction with the annexed drawings, discloses exemplary embodiments of the invention.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

Throughout the drawings, like reference numerals will be understood to refer to like parts, components and structures.

DETAILED DESCRIPTION OF THE INVENTION

FIGS. 2A through 10, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged power amplifier.

Technology for improving performance at a low power region at which a peaking amplifier does not operate in a Doherty amplifier is described below.

First, a technological basis of the present invention is described below.

Figure 1:
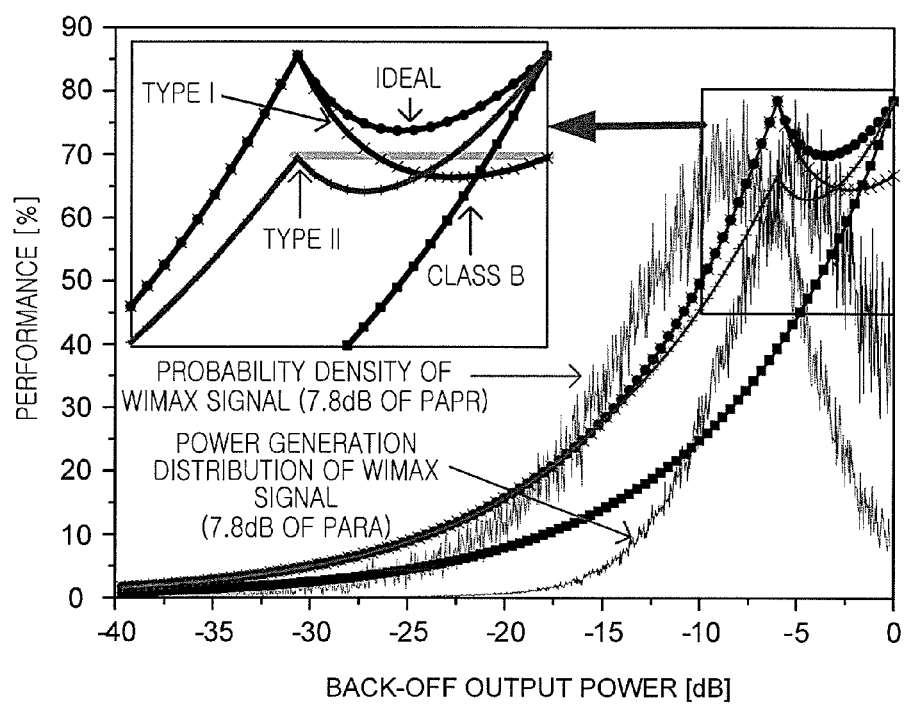
FIG. 1 is a graph illustrating a schematic performance characteristic of a general Doherty amplifier.
Figure 2A:
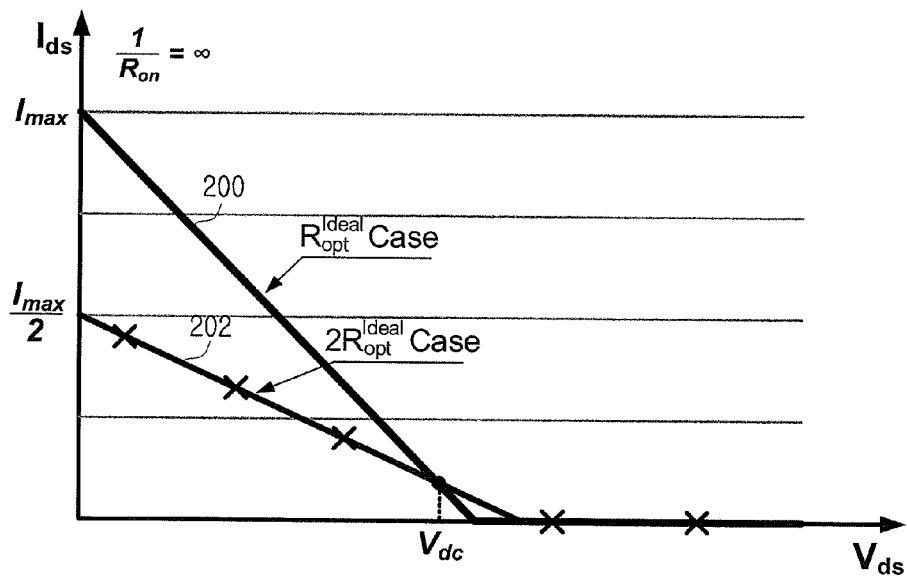
FIG. 2A is a graph illustrating a load line of a carrier amplifier in an ideal Doherty amplifier.

FIG. 2A illustrates a load line of a carrier amplifier in an ideal Doherty amplifier. The ideal Doherty amplifier represents a situation in which On-resistance ($R_{on}$) is equal to '0'. In FIG. 2A, the horizontal axis ($V_{ds}$) represents an output voltage, the vertical axis ($I_{ds}$) represents an output current, and '$R_{opt}$' represents an output impedance when a power amplifier outputs the maximum power.

A load line 200 when the carrier amplifier outputs the maximum power is described below. Output impedance, output power, and performance are expressed according to Equation 2 below:

$$R_{opt} = \frac{V_1}{I_1(\theta)} = \frac{V_{dc}}{I_1(\theta)} \quad [\text{Eqn. 2}]$$

$$P_{1,Ropt} = \frac{1}{2}I_1(\theta)V_1 = \frac{1}{2}I_1(\theta)V_{dc}$$

$$\eta_{Ropt} = \frac{P_{1,Ropt}}{P_{dc}} = \frac{\frac{1}{2}I_1(\theta)V_{dc}}{I_{dc}(\theta)V_{dc}} = \frac{\frac{1}{2}I_1(\theta)}{I_{dc}(\theta)}$$

In Equation 2 above, the '$R_{opt}$' represents the output matching impedance of a power amplifier at the maximum output power, the '$V_1$' represents a fundamental wave voltage component, the '$V_{dc}$' represents a direct current voltage component, the 'θ' represents a conduction angle of the amplifier, the '$I_1(\theta)$' represents a fundamental wave current component dependent on the conduction angle, the '$P_{1,Ropt}$' represents output power when an output matching impedance is equal to '$R_{opt}$', the '$\eta_{Ropt}$' represents performance when the output matching impedance is equal to the '$R_{opt}$', the '$P_{dc}$' represents direct current power applied to the power amplifier when the output matching impedance is equal to the '$R_{opt}$', and the '$I_{dc}(\theta)$' represents a direct current component dependent on the conduction angle.

The 'θ' is equal to $2\pi$ for a class A amplifier, and is less than $2\pi$ and is larger than $\pi$ for a class AB amplifier, and is $\pi$ for a class B amplifier, and is less than $\pi$ for a class C amplifier. And the '$I_1(\theta)$' and the '$I_{dc}(\theta)$' are given according to Equation 3 below:

$$I_1(\theta) = \frac{I_{max}}{2\pi} \frac{\theta - \sin\theta}{1 - \cos\left(\frac{\theta}{2}\right)} \quad [\text{Eqn. 3}]$$

$$I_{dc}(\theta) = \frac{I_{max}}{2\pi} \frac{2\sin\left(\frac{\theta}{2}\right) - \theta\cos\left(\frac{\theta}{2}\right)}{1 - \cos\left(\frac{\theta}{2}\right)}$$

In Equation 3 above, the 'θ' represents a conduction angle of an amplifier, the '$I_1(\theta)$' represents a fundamental wave current component dependent on the conduction angle, the '$I_{max}$' represents the maximum output current of the amplifier, and the '$I_{dc}(\theta)$' represents a direct current component dependent on the conduction angle.

In a general Doherty amplifier, a carrier amplifier operates with an output impedance of '$2R_{opt}$' at a low power region at which a peaking amplifier does not operate. In this situation, output impedance, output power, and performance regarding a load line 202 can be expressed according to Equation 4 below:

$$R_{2opt} = \frac{V_1}{\frac{1}{2}I_1(\theta)} = 2\frac{V_{dc}}{I_1(\theta)} = 2R_{opt} \quad [\text{Eqn. 4}]$$

$$P_{1,2Ropt} = \frac{1}{2}\left(\frac{1}{2}I_1(\theta)\right)V_1 = \frac{1}{2}\left(\frac{1}{2}I_1(\theta)\right)V_{dc} = \frac{1}{2}P_{1,Ropt}$$

$$\eta_{2Ropt} = \frac{P_{1,2Ropt}}{P_{dc}} = \frac{\frac{1}{2}\left(\frac{1}{2}I_1(\theta)\right)V_{dc}}{\frac{1}{2}I_{dc}(\theta)V_{dc}} = \frac{\frac{1}{2}I_1(\theta)}{I_{dc}(\theta)} = \eta_{Ropt}$$

In Equation 4 above, the '$2R_{opt}$' represents an output matching impedance, the '$V_1$' represents a fundamental wave voltage component, the '$V_{dc}$' represents a direct current voltage component, the 'θ' represents a conduction angle of an amplifier, the '$I_1(\theta)$' represents a fundamental wave current component dependent on the conduction angle, the '$P_{1,2Ropt}$' represents output power when an output matching impedance is equal to '$2R_{opt}$', the '$P_{1,Ropt}$' represents output power when the output matching impedance is equal to '$R_{opt}$', the '$\eta_{2Ropt}$' represents performance when the output matching impedance is equal to the '$2R_{opt}$', the '$P_{dc}$' represents direct current power applied to a power amplifier when the output matching impedance is equal to the '$2R_{opt}$', and the '$I_{dc}(\theta)$' represents a direct current component dependent on the conduction angle.

Through Equations 2 and 3 above, it is confirmed that an ideal Doherty amplifier reaches the maximum performance when power 3 dB-decreasing relative to the maximum power is outputted. This means that performance is maximized by allowing a carrier amplifier to perform sufficient saturation operation before a peaking amplifier operates.

Figure 2B:
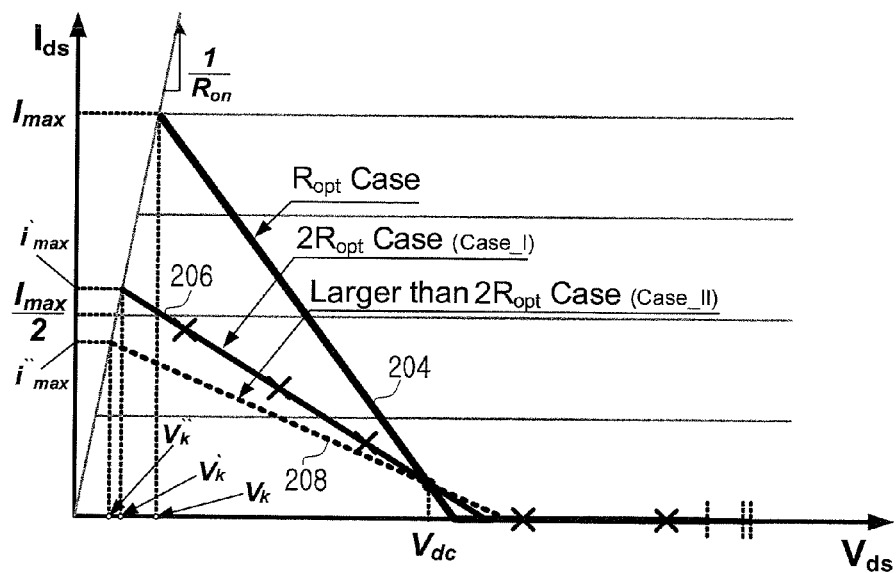
FIG. 2B is a graph illustrating a load line of a carrier amplifier in a general Doherty amplifier.

FIG. 2B illustrates a load line of a carrier amplifier in a general Doherty amplifier. In FIG. 2B, the horizontal axis ($V_{ds}$) represents an output voltage, the vertical axis ($I_{ds}$) represents an output current, and '$R_{opt}$' represents an output impedance when a power amplifier outputs the maximum power.

As illustrated in FIG. 2B, in a general Doherty amplifier, there is a knee voltage ($V_k$) because On-resistance ($R_{on}$) is not equal to '0'. Referring to a load line 204 at the maximum power output of the general Doherty amplifier illustrated in FIG. 2B, output impedance, output power, and performance can be expressed according to Equation 5 below:

$$R_{opt} = \frac{V_1}{I_1(\theta)} = \frac{V_{dc} - V_k}{I_1(\theta)} \quad [\text{Eqn. 5}]$$

$$P_{1,Ropt} = \frac{1}{2}I_1(\theta)V_1 = \frac{1}{2}I_1(\theta)(V_{dc} - V_k)$$

$$\eta_{Ropt} = \frac{P_{1,Ropt}}{P_{dc}} = \frac{\frac{1}{2}I_1(\theta)(V_{dc} - V_k)}{I_{dc}(\theta)V_{dc}}$$

In Equation 5 above, the '$R_{opt}$' represents an output matching impedance, the '$V_1$' represents a fundamental wave voltage component, the '$V_{dc}$' represents a direct current voltage component, the '$V_k$' represents a knee voltage when an output matching impedance is equal to '$R_{opt}$', the 'θ' represents a conduction angle of an amplifier, the '$I_1(\theta)$' represents a fundamental wave current component dependent on the conduction angle, the '$P_{1Ropt}$' represents output power when the output matching impedance is equal to the '$R_{opt}$', the '$\eta_{Ropt}$' represents performance when the output matching impedance is equal to the '$R_{opt}$', the '$P_{dc}$' represents direct current power applied to a power amplifier when the output matching impedance is equal to the '$R_{opt}$', and the '$I_{dc}(\theta)$' represents a direct current component dependent on the conduction angle.

Unlike an ideal Doherty amplifier, a general Doherty amplifier is affected by the knee voltage ($V_k$) and thus, output impedance, output power, and performance are changed.

When the output impedance of a carrier amplifier is equal to '$2R_{opt}$', the maximum value of an output current '$I_{ds}$' can be determined according to Equation 6 below:

$$R^{Case1} = \frac{V_1}{I_1'(\theta)} = \frac{V_{dc} - V_k'}{I_1'(\theta)} = 2R_{opt} = 2\frac{V_{dc} - V_k}{I_1(\theta)} \quad [\text{Eqn. 6}]$$

$$2I_1'(\theta)(V_{dc} - V_k) = I_1(\theta)(V_{dc} - V_k')$$

$$2i_{max}'(V_{dc} - V_k) = I_{max}(V_{dc} - V_k') = I_{max}(V_{dc} - i_{max}'R_{on})$$

$$i_{max}'(2V_{dc} - 2V_k + I_{max}R_{on}) = I_{max}V_{dc}$$

$$\therefore i_{max}' = \frac{I_{max}V_{dc}}{2V_{dc} - I_{max}R_{on}}$$

In Equation 6 above, the '$R^{Case1}$' represents a $2R_{opt}$ impedance when a knee voltage ($V_k$) exists, the '$V_1$' represents a fundamental wave voltage component, the '$V_{dc}$' represents a direct current voltage component, the '$V_k'$' represents a knee voltage when an output matching impedance is equal to '$2R_{opt}$', the '$\theta$' represents a conduction angle of an amplifier, the '$I_1'(\theta)$' represents a fundamental wave current component dependent on the conduction angle when the output matching impedance is equal to the '$R^{Case1}$', the '$I_1(\theta)$' represents a fundamental wave current component dependent on the conduction angle when the output matching impedance is equal to the '$R_{opt}$' and the knee voltage ($V_k$) exists, the '$i_{max}'$' represents the maximum current when the output matching impedance is equal to the '$2R_{opt}$', the '$I_{max}$' represents the maximum output current of an amplifier, and the '$R_{on}$' represents On-resistance.

Referring to the load line 202 illustrated in FIG. 2A, in the ideal Doherty amplifier, when it operates at $2R_{opt}$, the maximum value of an output current is equal to $I_{max}/2$. However, referring to a load line 206 illustrated in FIG. 2B, in the general Doherty amplifier, the maximum value of an output current is larger than the $I_{max}/2$ due to the knee voltage ($V_k$). Also, in the general Doherty amplifier, a voltage magnitude also increases as '$R_{opt}$' becomes '$2R_{opt}$'.

Figure 2C:
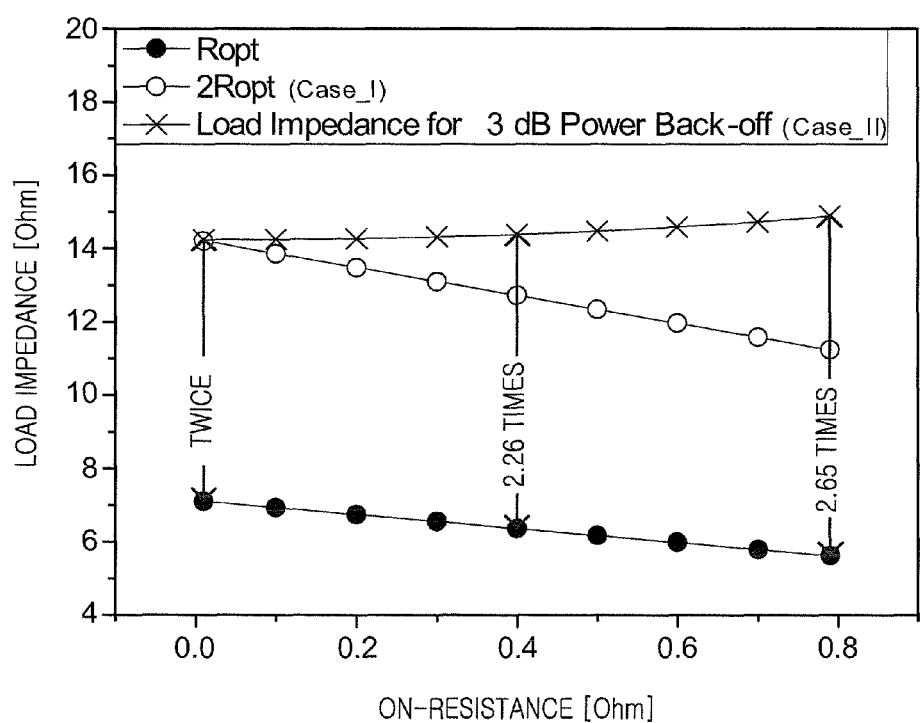
FIG. 2C is a graph illustrating a load impedance dependent on On-resistance ($R_{on}$) of a carrier amplifier in a general Doherty amplifier.

FIG. 2C illustrates a load impedance dependent on On-resistance ($R_{on}$) for when the output impedance of a carrier amplifier is equal to '$R_{opt}$', is equal to '$2R_{opt}$', and is larger than '$2R_{opt}$' in a general Doherty amplifier.

Figure 2D:
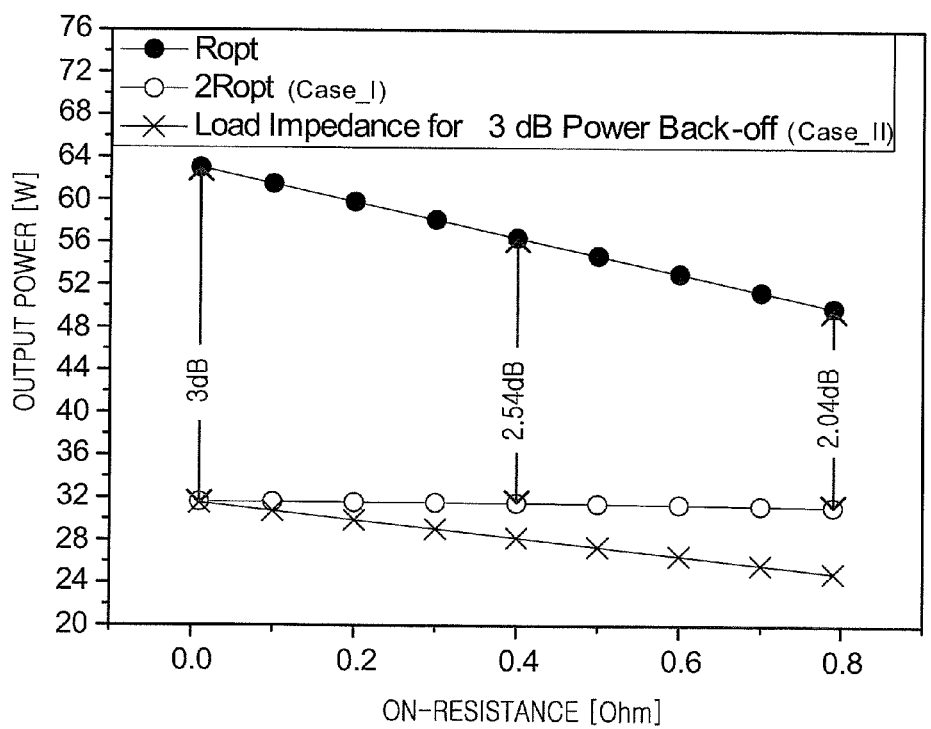
FIG. 2D is a graph illustrating output power dependent on On-resistance ($R_{on}$) of a carrier amplifier in a general Doherty amplifier.

FIG. 2D illustrates output power dependent on On-resistance ($R_{on}$) for when the output impedance of a carrier amplifier is equal to '$R_{opt}$', is equal to '$2R_{opt}$', and is larger than '$2R_{opt}$' in a general Doherty amplifier. Referring to FIG. 2D, of the output impedance of a carrier amplifier is equal to '$2R_{opt}$', output power is backed off less than 3 dB relative to the maximum output. This means that performance cannot be optimized at a low power region, particularly, at a 6 dB backed-off region.

To maximize performance at a 3 dB backed-off region and a low output power region, the present invention makes the output impedance of a carrier amplifier at the time of the non-operation of a peaking amplifier larger than '$2R_{opt}$'. That is, the present invention sets the output impedance of the carrier amplifier such that 3 dB back-off compared to the maximum output power happens at the time of the non-operation of the peaking amplifier. At this time, the maximum current magnitude operable can be expressed according to Equation 7 below:

$$P_1^{Case2} = \frac{1}{2}I_1''(\alpha)(V_{dc} - V_k'') = \frac{1}{2}P_{1,Ropt} = \frac{1}{2}\left[\frac{1}{2}I_1(\alpha)(V_{dc} - V_k)\right] \quad [\text{Eqn. 7}]$$

$$I_1''(\alpha)(V_{dc} - V_k'') = \frac{1}{2}I_1(\alpha)(V_{dc} - V_k)$$

$$2i_{max}''(V_{dc} - i_{max}''R_{on}) = I_{max}(V_{dc} - V_k)$$

$$2R_{on}(i_{max}'')^2 - 2V_{dc}i_{max}'' + I_{max}(V_{dc} - V_k) = 0$$

$$i_{max}'' = \frac{1}{R_{on}}\frac{V_{dc} - \sqrt{(V_{dc})^2 - 2V_k(V_{dc} - V_k)}}{2}$$

In Equation 7 above, the '$R^{Case2}$', represents an output matching impedance outputting the half of power compared to the maximum output power when there is a knee voltage ($V_k$), the '$I_1''(\alpha)$' represents a fundamental wave current component dependent on a conduction angle when an output matching impedance is equal to '$R^{Case2}$', the '$V_{dc}$' represents a direct current voltage component, the '$V_k''$' is a knee voltage when the output matching impedance is larger than '$2R_{opt}$', the '$P_{1,Ropt}$' represents output power when the output matching impedance is equal to the '$R_{opt}$', the '$I_1(\alpha)$' represents a fundamental wave current component when the output matching impedance is equal to the '$R_{opt}$', the '$V_k$' represents a knee voltage when the output matching impedance is equal to the '$R_{opt}$', the '$i_{max}''$' represents the maximum current when the output matching impedance is larger than the '$2R_{opt}$', and the '$I_{max}$' represents the maximum output current of an amplifier.

Referring to Equation 7 above and a load line 208 of FIG. 2B, the maximum current magnitude should further decrease such that output power becomes 3 dB back-off of the maximum output power, due to the existence of the knee voltage of ($V_k$). Also, referring to FIGS. 2C and 2D, an output impedance should be twice or more of '$R_{opt}$' such that output power becomes 3 dB back-off of the maximum output power, due to the knee voltage ($V_k$).

Figure 3:
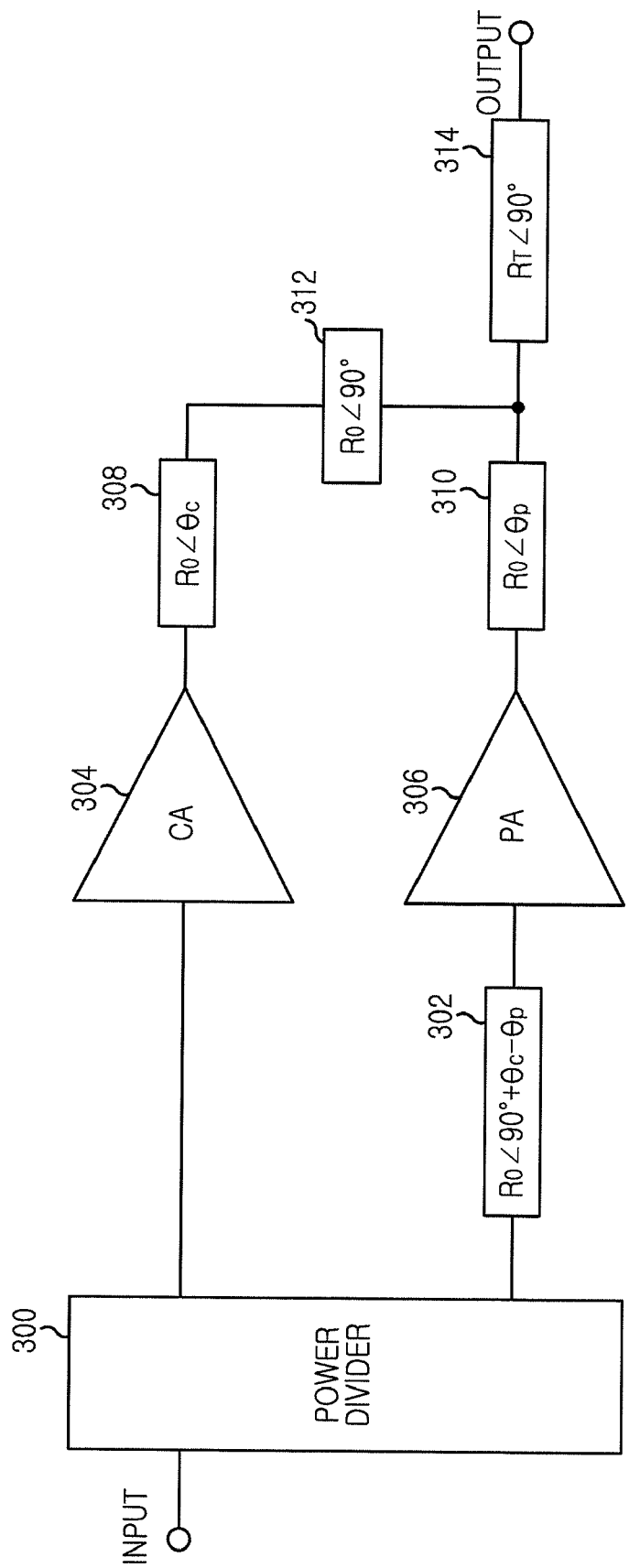
FIG. 3 is a block diagram illustrating a construction of a 2-way Doherty amplifier according to an embodiment of the present invention.

FIG. 3 illustrates a construction of a 2-way Doherty amplifier according to an embodiment of the present invention.

As illustrated in FIG. 3, the Doherty amplifier includes a power divider 300, a transmission line 302, a carrier amplifier 304, a peaking amplifier 306, offset lines 308 and 310, a 1st quarter-wave transmission line 312, and a 2nd quarter-wave transmission line 314.

The power divider 300 divides a signal inputted to the Doherty amplifier into two power signals, provides one of the two power signals to the peaking amplifier 306, and provides the other of the two power signals to the carrier amplifier 304. The transmission line 302 synchronizes a phase between the signal provided to the carrier amplifier 304 and the signal provided to the peaking amplifier 306. A magnitude of impedance of the transmission line 302 is $R_0$, a phase of impedance of the transmission line 302 is $90+\theta_c-\theta_p$. Herein, $\theta_c$ is a phase of impedance of the offset line 308, and $\theta_p$ is a phase of impedance of the offset line 310. If the phases of the two signals outputted from the power divider 300 are the same as each other, the transmission line 302 may be excluded.

The peaking amplifier 306 and the carrier amplifier 304 amplify the power of the signals from the power divider 300.

The minimum values of the respective input signals operating the peaking amplifier 306 and the carrier amplifier 304 are different from each other. That is, the minimum value of input power operating the peaking amplifier 306 is larger than the minimum value of input power operating the carrier amplifier 304. Thus, there is a power range in which the peaking amplifier 306 does not operate although the carrier amplifier 304 operates. For example, when the peaking amplifier 306 and the carrier amplifier 304 use a Direct Current (DC) bias, the carrier amplifier 304 uses a high DC bias compared to the peaking amplifier 306, whereby the aforementioned power range relationship can be configured. Thus, the peaking amplifier 306 initiates operation when an input signal with high power relative to the carrier amplifier 304 is applied. That is, if an input signal with power below a threshold value for an operation of the peaking amplifier 306 is applied, only the carrier amplifier 304 operates and, in this situation, the peaking amplifier 306 is equivalent with an open circuit. According to an embodiment of the present invention, input/output matching circuits of the carrier amplifier 304 and the peaking amplifier 306 can be realized identically such that the amplifiers 304 and 306 all reach the maximum output of the same output value under the characteristic impedance (e.g., 50Ω) of the same value. Or, the output impedance of the carrier amplifier 304 can be realized larger than the output impedance of the peaking amplifier 306.

The offset lines 308 and 310 allow load modulation to be performed when the peaking amplifier 306 does not operate. For example, the offset line 308 connecting to an output port of the carrier amplifier 304 allows the occurrence of load modulation for not only a real component but an imaginary component. The offset line 310 connecting to an output port of the peaking amplifier 306 allows an output impedance to be a large value when the peaking amplifier does not operate, thereby preventing an output power leakage of the carrier amplifier 304, and inducing accurate load modulation.

The 1st quarter-wave transmission line 312 and the 2nd quarter-wave transmission line 314 are a construction for Doherty operation of changing load impedance depending on the operation or non-operation of the peaking amplifier. For convenience of description in the present disclosure, a combination of the 1st quarter-wave transmission line 312 and the 2nd quarter-wave transmission line 314 is called a Doherty circuit. The Doherty circuit forms load impedances of the peaking amplifier 306 and the carrier amplifier 304. The 1st quarter-wave transmission line 312 and the 2nd quarter-wave transmission line 314 are described below in detail.

The 1st quarter-wave transmission line 312 is located between the offset lines 308 and 310, and performs the role of an impedance inverter. That is, the 1st quarter-wave transmission line 312 inversely changes a load impedance output. For example, the 1st quarter-wave transmission line 312 changes a load impedance output ($R_0/M$) into $MR_0$. Here, the 'M' is a positive integer.

The 2nd quarter-wave transmission line 314 is located between an output end and the offset line 310. According to a Doherty amplifier of the conventional art, the characteristic impedance ($R_T$) of the 2nd quarter-wave transmission line 314 is designed such that the load impedance of the carrier amplifier 304 at the time of the non-operation of the peaking amplifier 306 becomes twice the load impedance of the carrier amplifier 304 at the time of the operation of the peaking amplifier 306. For example, according to a Doherty amplifier of the conventional art, when the output load impedance ($R_0$) of the Doherty amplifier is equal to 50Ω, the characteristic impedance ($R_T$) of the 2nd quarter-wave transmission line 314 is equal to $\sqrt{50\times 25}\Omega$. According to this, during the non-operation of the peaking amplifier 306, the output impedance of the carrier amplifier 304 becomes 100Ω and thus, a high performance characteristic can be obtained at a backed-off region. In contrast, when the carrier amplifier 304 and the peaking amplifier 306 are both in operation, the output impedance of the carrier amplifier 304 is load-modulated from 100Ω to 50Ω, and the output impedance of the peaking amplifier 306 is load-modulated from ∞ to 50Ω. In contrast, an embodiment of the present invention sets the matching impedance of the carrier amplifier 304 at a greater value, thereby allowing the carrier amplifier 304 to perform sufficient saturation operation at a backed-off region during the non-operation of the peaking amplifier 306. Thus, a characteristic impedance ($R_T$) of the 2nd quarter-wave transmission line 314 provided in a Doherty amplifier according to an embodiment of the present invention is designed to be a value less than $\sqrt{50\times 25}\Omega$. As such, the carrier amplifier 304 has an output impedance larger than 100Ω at a low power region at which the peaking amplifier 306 does not operate, thereby increasing performance at a backed-off region.

Similarly, a Doherty amplifier according to an embodiment of the present invention is constructed to have a larger output impedance of the carrier amplifier 304 than that of a Doherty amplifier of the conventional art at a low power region, through the 2nd quarter-wave transmission line 314, a transmission line for the same purpose as this or a lumped element, a combination of two or more, and such.

Figure 4:
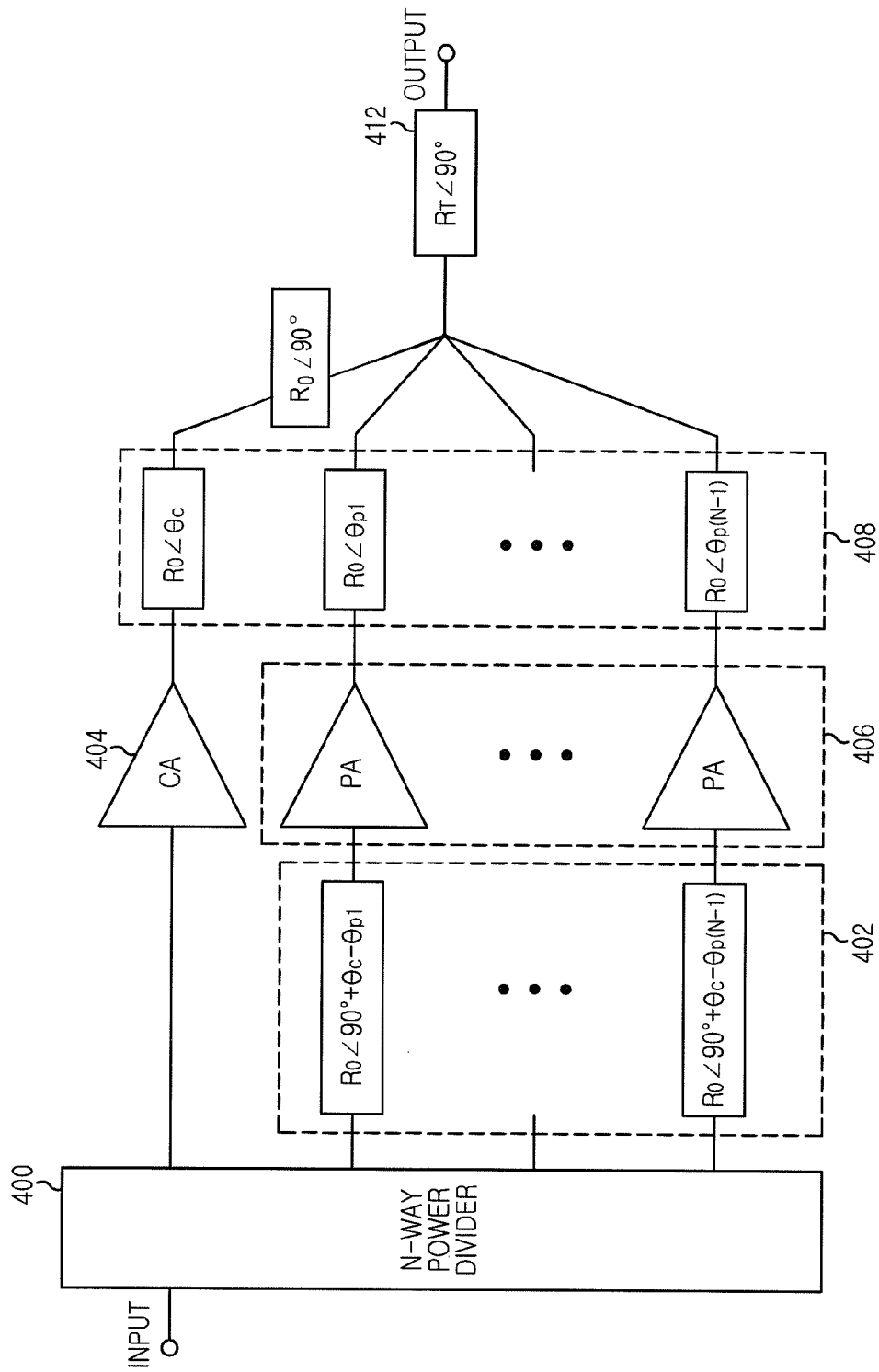
FIG. 4 is a block diagram illustrating a construction of an N-way Doherty amplifier according to an embodiment of the present invention.

FIG. 4 illustrates a construction of an N-way Doherty amplifier according to an embodiment of the present invention.

As illustrated in FIG. 4, the Doherty amplifier includes an N-way power divider 400, transmission lines 402, a carrier amplifier 404, an (N−1) number of peaking amplifiers 406, offset lines 408, a 1st quarter-wave transmission line 410, and a 2nd quarter-wave transmission line 412.

The N-way power divider 400 divides a signal inputted to the Doherty amplifier into an N number of power signals, and provides each of the N number of power signals to the peaking amplifiers 406 and the carrier amplifier 404. The transmission lines 402 synchronize a phase between the signal provided to the carrier amplifier 404 and the signals provided to the peaking amplifiers 406. A magnitude of impedances of the transmission lines 402 is $R_0$, phases of impedances of the transmission lines 402 are $90+\theta_c-\theta_{p1}, \ldots, 90+\theta_c-\theta_{p(N-1)}$. Herein, $\theta_c, \theta_{p1}, \ldots, \theta_{p(N-1)}$ are phases of impedances of the offset lines 408. If the phases of the N number of signals outputted from the power divider 400 are the same as each other, the transmission line 402 can be excluded.

The carrier amplifier 404 and the (N−1) number of peaking amplifiers 406 amplify power of a signal inputted from the N-way power divider 400. At this time, power ranges of respective input signals operating the (N−1) number of peaking amplifiers 406 and the carrier amplifier 404 are different from each other. That is, the minimum value of input power operating the (N−1) number of peaking amplifiers 406 is larger than the minimum value of input power operating the carrier amplifier 404. Thus, there is a power range in which the (N−1) number of peaking amplifiers 406 do not operate although the carrier amplifier 404 operates. For example, when the carrier amplifier 404 and the (N−1) number of peaking amplifiers 406 use a DC bias, the carrier amplifier 404 uses a high DC bias compared to the (N−1) number of peaking amplifiers 406, whereby the aforementioned power range relationship can be configured. Thus, the (N−1) number of peaking amplifiers 406 operate when an input signal with high power compared to the carrier amplifier 404 is applied. That is, if an input signal with power below a threshold value for an operation of the (N−1) number of peaking amplifiers 406 is applied, only the carrier amplifier 404 operates and, in this situation, the (N−1) number of peaking amplifiers 406 are equivalent with an open circuit. According to an embodiment of the present invention, input/output matching circuits of the carrier amplifier 404 and the (N−1) number of peaking amplifiers 406 can be realized identically such that the amplifiers 404 and 406 all reach the maximum output with the same output value under the characteristic impedance (e.g., 50Ω) of the same value. Alternatively, the output impedance of the carrier amplifier 404 can be realized larger than the output impedance of the (N−1) number of peaking amplifiers 406.

When the (N−1) number of peaking amplifiers 406 do not operate, the offset lines 408 increase a load impedance output, thus allowing suitable load modulation to be performed. For example, the offset line connecting to an output port of the carrier amplifier 404 allows the occurrence of load modulation for not only a real component but an imaginary component. When the (N−1) number of peaking amplifiers 406 do not operate, the offset lines connecting to output ports of the (N−1) number of peaking amplifiers 406 allow an output impedance to be a large value, thereby preventing an output power leakage of the carrier amplifier 404, and inducing accurate load modulation.

The 1st quarter-wave transmission line 410 and the 2nd quarter-wave transmission line 412 are a Doherty circuit for Doherty operation of changing a load impedance depending on the operation or non-operation of the peaking amplifier. The Doherty circuit forms load impedances of the (N−1) number of peaking amplifiers 406 and the carrier amplifier 404. The 1st quarter-wave transmission line 410 and the 2nd quarter-wave transmission line 412 are described below in detail.

The 1st quarter-wave transmission line 410 is located between the offset lines 408, and performs the role of an impedance inverter. That is, the 1st quarter-wave transmission line 410 inversely changes a load impedance output. For example, the 1st quarter-wave transmission line 410 changes a load impedance output ($R_0/M$) into $MR_0$. Here, the 'M' is a positive integer.

The 2nd quarter-wave transmission line 412 is located between an output end and the offset line 408. According to a Doherty amplifier of the conventional art, the characteristic impedance ($R_T$) of the 2nd quarter-wave transmission line 412 is designed such that the load impedance of the carrier amplifier 404 at the time of the non-operation of the peaking amplifiers 406 becomes 'N' times of the load impedance of the carrier amplifier 404 at the time of the operation of the peaking amplifiers 406. For example, according to a Doherty amplifier of the conventional art, when the output load impedance ($R_0$) of the Doherty amplifier is equal to 50Ω, the characteristic impedance ($R_T$) of the 2nd quarter-wave transmission line 412 is equal to $$\sqrt{50 \times \frac{50}{N}}\ \Omega.$$

In contrast, the characteristic impedance ($R_T$) of the 2nd quarter-wave transmission line 412 provided in a Doherty amplifier according to an embodiment of the present invention is designed to be a value less than $$\sqrt{50 \times \frac{50}{N}}\ \Omega.$$

Figure 5:
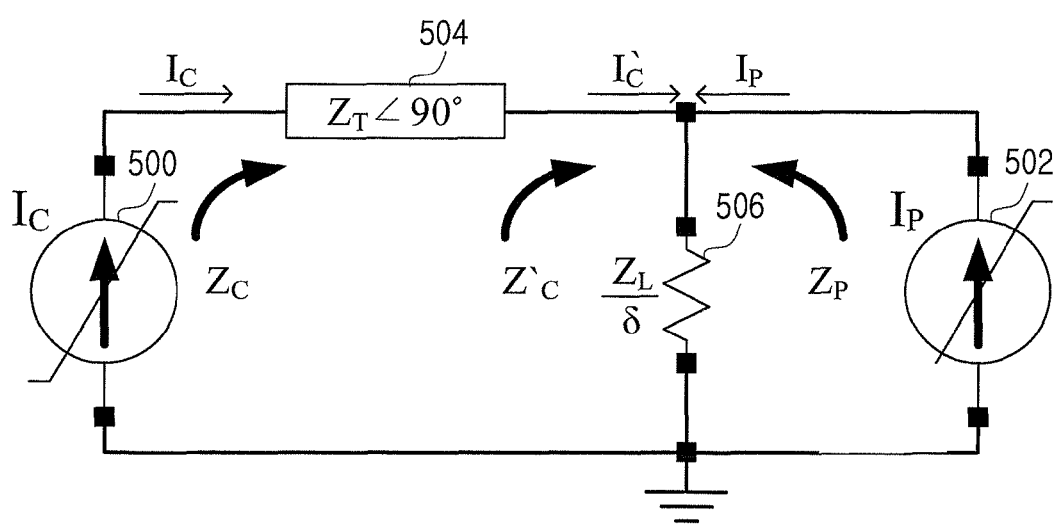
FIG. 5 is a diagram illustrating an equivalent circuit of a Doherty amplifier according to an embodiment of the present invention.

FIG. 5 illustrates an equivalent circuit of a Doherty amplifier according to an embodiment of the present invention.

As illustrated in FIG. 5, the equivalent circuit includes a carrier current source 500, a peaking current source 502, a 1st quarter-wave transmission line 504, and a load impedance 506 of the Doherty amplifier converted through a 2nd quarter-wave transmission line.

In a Doherty amplifier of the conventional art, a load impedance 506 ($Z_L/\delta$) is equal to $Z_T/2$ ($Z_L=Z_T/2$, $\delta=1$). In this situation, when the peaking current source 502 does not operate, the output impedance of the carrier current source 500 becomes $2Z_T$. In contrast, in a Doherty amplifier according to an embodiment of the present invention, $\delta$ is less than '1' and thus, the output impedance of the carrier current source 500 has a value greater than $2Z_T$ at the time of the non-operation of the peaking current source 502, thereby maximizing performance at a low power region.

Figure 6:
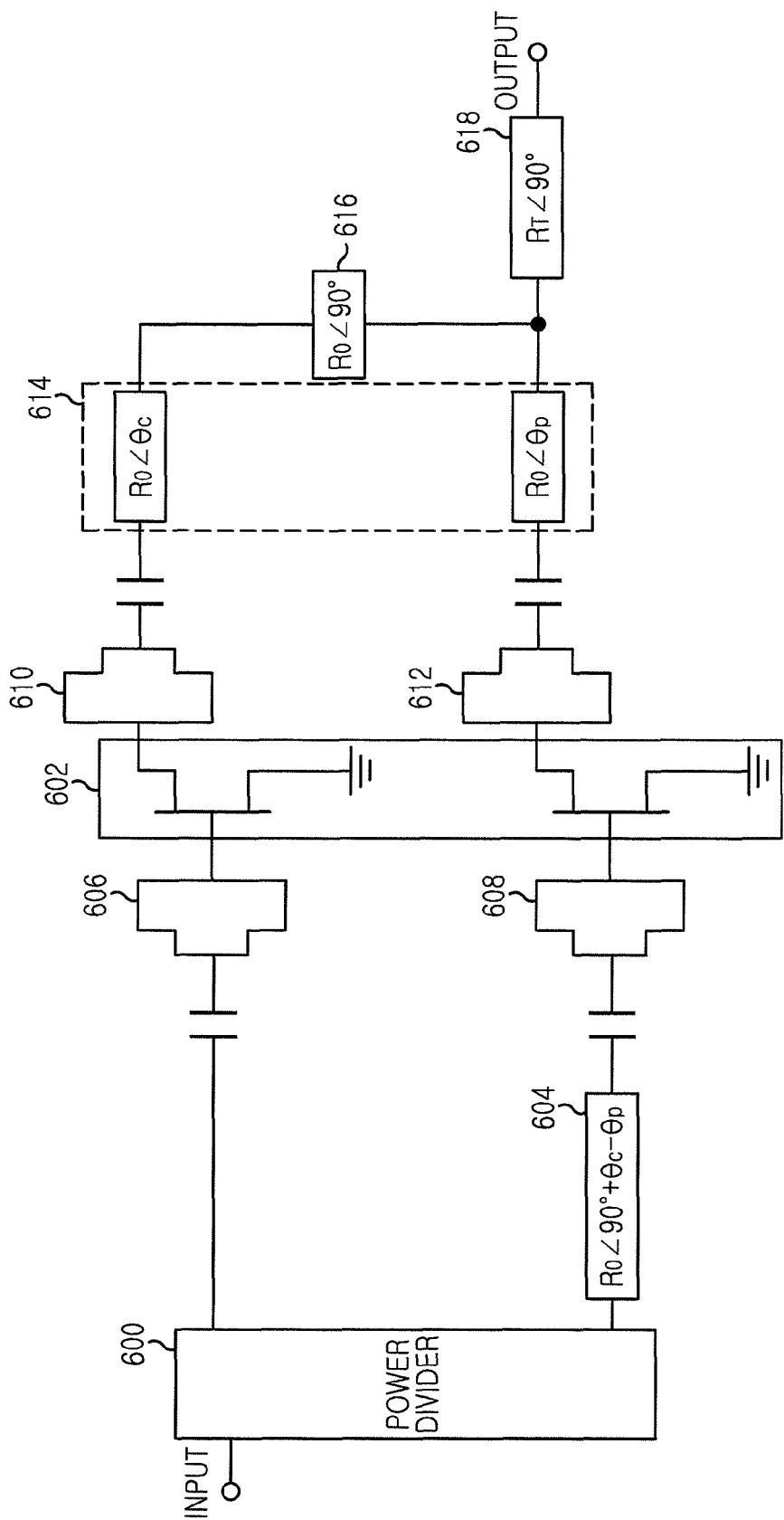
FIG. 6 is a diagram illustrating a circuit construction of a 2-way Doherty amplifier according to an embodiment of the present invention.

FIG. 6 illustrates a circuit construction of a 2-way Doherty amplifier according to an embodiment of the present invention. As illustrated in FIG. 6, the 2-way Doherty amplifier is realized including a power divider 600, and a solid-state device 602 of a carrier amplifier and a peaking amplifier. Here, the carrier amplifier and the at least one peaking amplifier can be realized using a transistor of the same size. Also, the Doherty amplifier is realized including a transmission line 604 for phase synchronization of the carrier amplifier and the peaking amplifier, an input matching circuit 606 for the carrier amplifier, an input matching circuit 608 for the peaking amplifier, an output matching circuit 610 for the carrier amplifier, an output matching circuit 612 for the peaking amplifier, offset lines 614, a 1st quarter-wave transmission line 616, and a 2nd quarter-wave transmission line 618.

Figure 7:
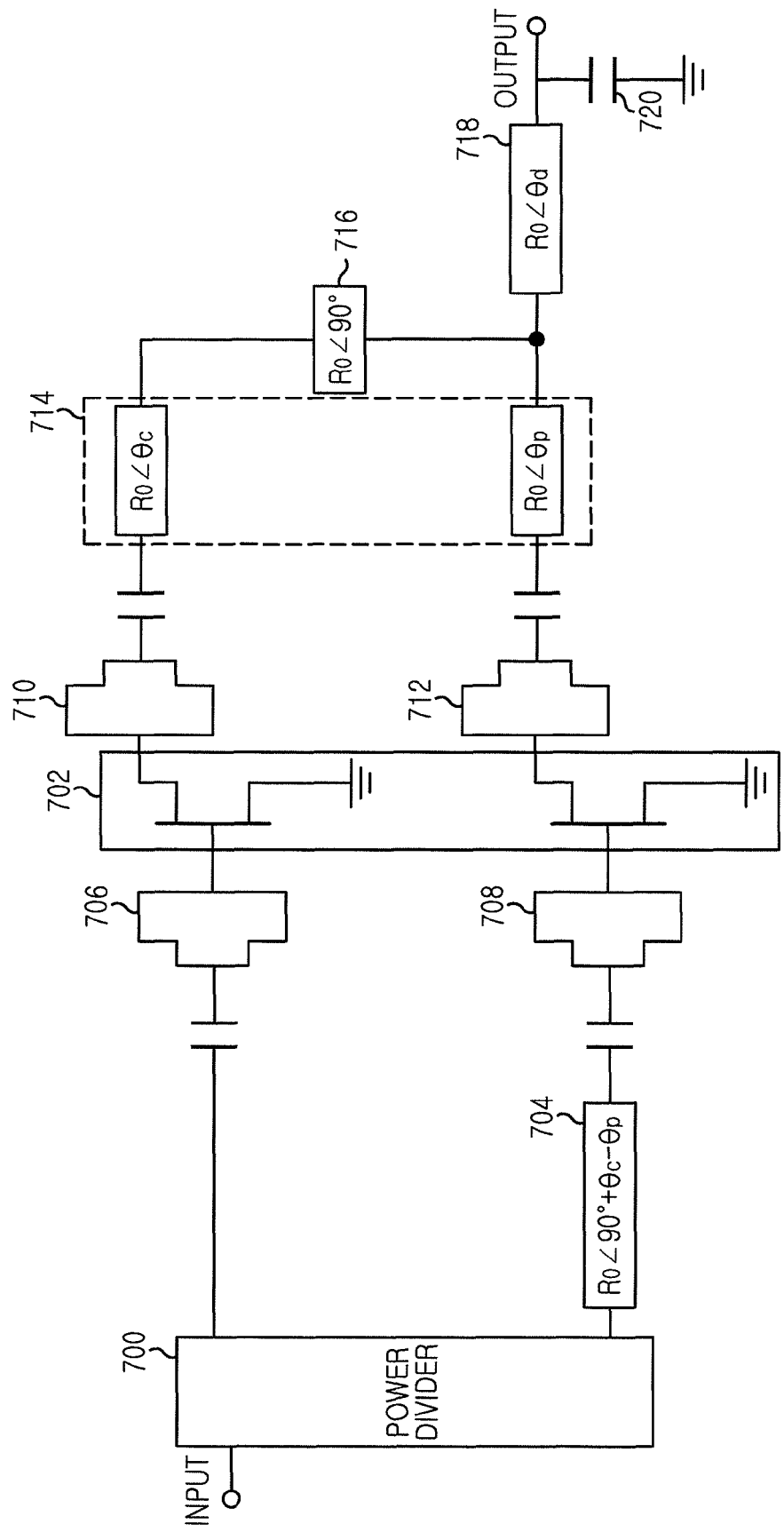
FIG. 7 is a diagram illustrating a circuit construction of an N-way Doherty amplifier according to an embodiment of the present invention.

FIG. 7 illustrates a circuit construction of a 2-way Doherty amplifier according to an embodiment of the present invention. As illustrated in FIG. 7, the 2-way Doherty amplifier is realized including a power divider 700, and a solid-state device 702 of a carrier amplifier and a peaking amplifier. Here, the carrier amplifier and the at least one peaking amplifier can be realized using a transistor of the same size. Also, the Doherty amplifier is realized including a transmission line 704 for phase synchronization of the carrier amplifier and the peaking amplifier, an input matching circuit 706 for the carrier amplifier, an input matching circuit 708 for the peaking amplifier, an output matching circuit 710 for the carrier amplifier, an output matching circuit 712 for the peaking amplifier, offset lines 714, a 1st quarter-wave transmission line 716, a predetermined length of transmission line 718, and a storage battery 720 connecting in parallel with the transmission line 718.

Figure 8:
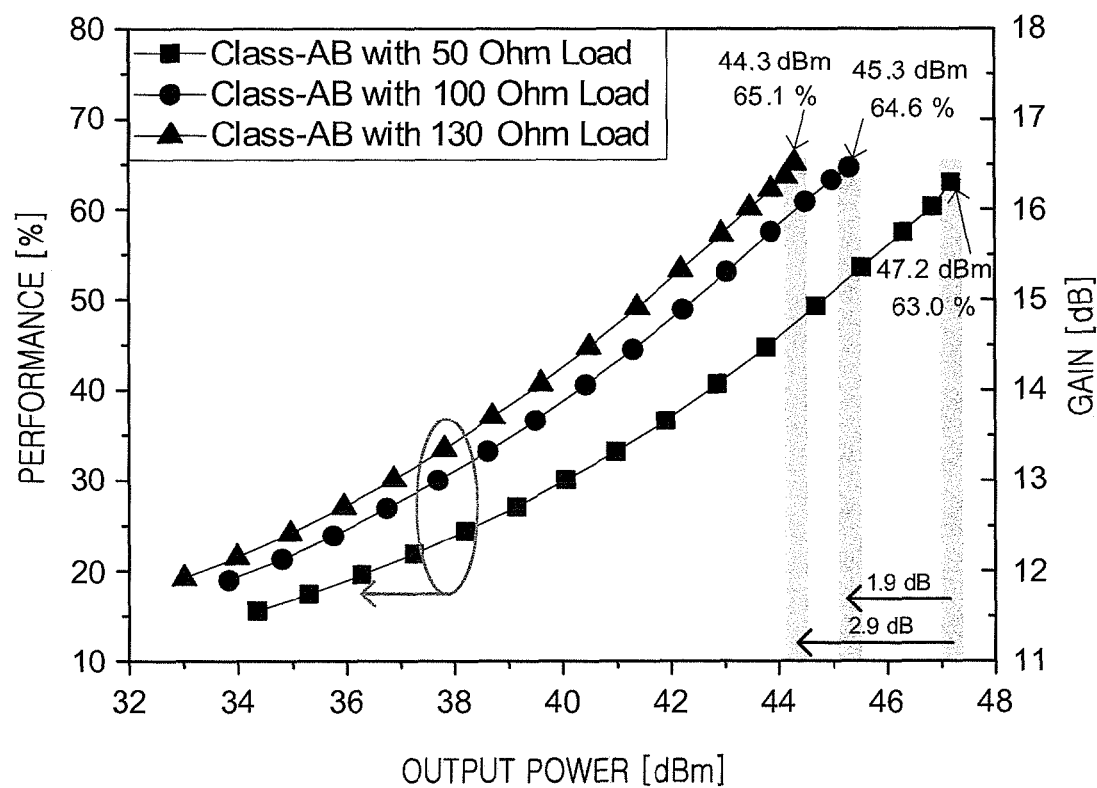
FIG. 8 is a graph illustrating the performance characteristic of a carrier amplifier in a Doherty amplifier.

FIG. 8 illustrates the performance characteristic of a carrier amplifier in a Doherty amplifier. Referring to FIG. 8, because a carrier amplifier does not perform sufficient saturation operation at a 3 dB backed-off region regarding a twice load impedance, it can be confirmed that the maximum performance is not generated. In contrast, when it is designed using 2.6 times of a load impedance considering On-resistance, the maximum performance is generated through sufficient saturation operation at approximately a 3 dB backed-off region, and a high performance characteristic is given throughout the low power region due to a large load impedance.

Figure 9:
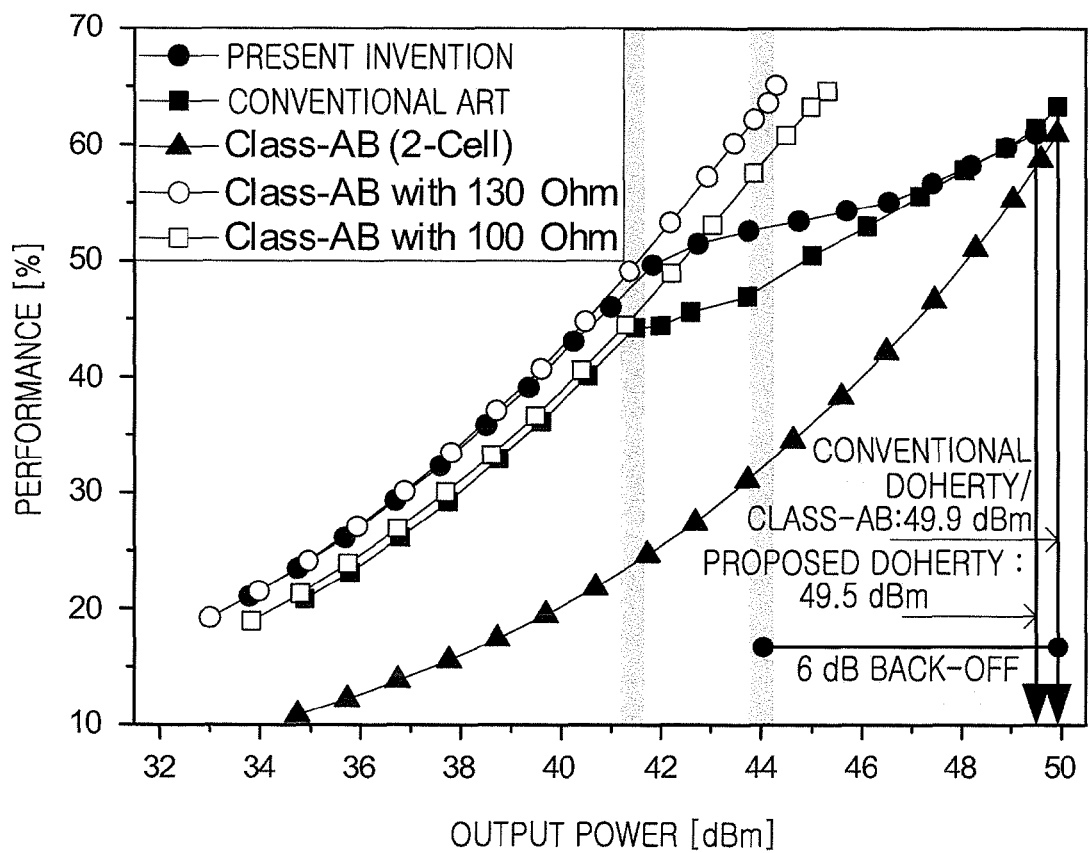
FIG. 9 is a graph illustrating performance characteristics for Continuous Wave (CW) signals of a Doherty amplifier according to an embodiment of the present invention and a Doherty amplifier of the conventional art.

FIG. 9 illustrates performance characteristics for CW signals of a Doherty amplifier according to an embodiment of the present invention and a Doherty amplifier of the conventional art. Referring to FIG. 9, the Doherty amplifier of the present invention shows a high performance characteristic for a low power region compared to the Doherty amplifier of the conventional art.

Figure 10:
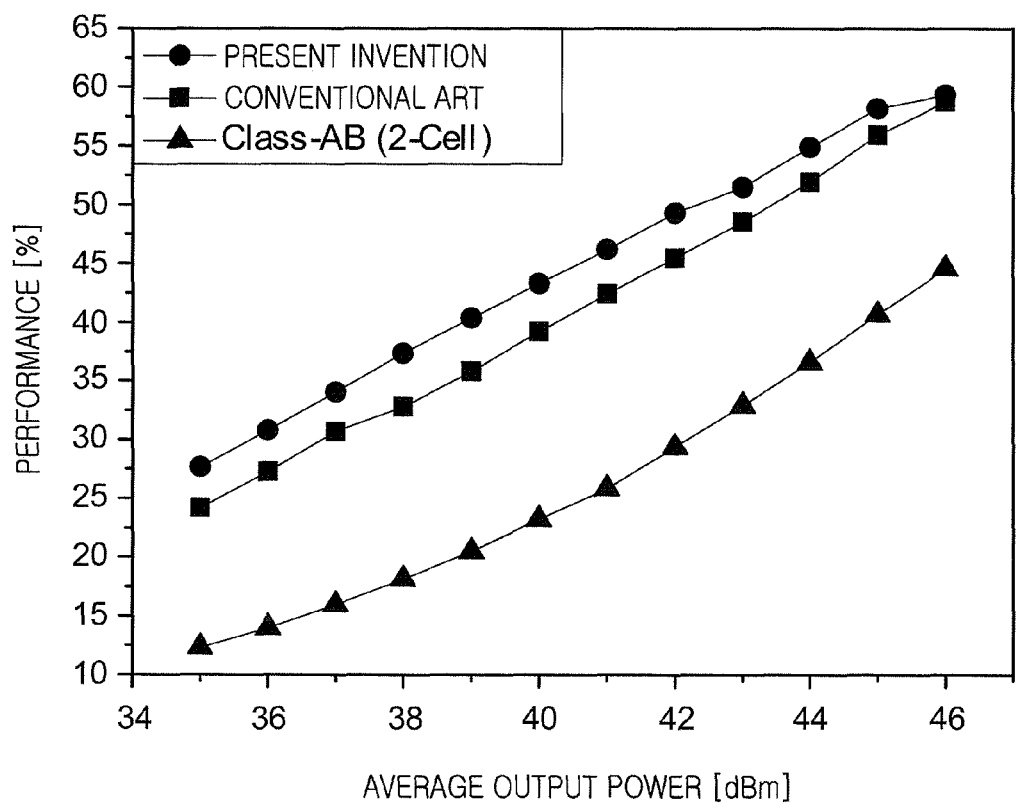
FIG. 10 is a graph illustrating performance characteristics for World Interoperability for Microwave Access (WiMAX) signals of a Doherty amplifier according to an embodiment of the present invention and a Doherty amplifier of the conventional art.

FIG. 10 illustrates performance characteristics for WiMAX signals of a Doherty amplifier according to an embodiment of the present invention and a Doherty amplifier of the conventional art. Referring to FIG. 10, the Doherty amplifier of the present invention shows a high performance characteristic for a low power region as compared to the Doherty amplifier of the conventional art. Furthermore, it is confirmed that performance increases by approximately 4% for all power regions.

Amplification performance is increased by increasing the output impedance of a carrier amplifier at a low power region in a Doherty amplifier as compared to the conventional art.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A Doherty amplifier apparatus comprising:
    a power divider configured to provide a power signal to each of a carrier amplifier and at least one peaking amplifier;
    the carrier amplifier configured to amplify power of a signal inputted from the power divider;
    the at least one peaking amplifier configured to amplify power of a signal inputted from the power divider;
    offset lines configured to control a load impedance when the at least one peaking amplifier does not operate; and
    a Doherty circuit configured to generate the load impedance of the carrier amplifier that is larger than twice a load impedance at a maximum output power of the carrier amplifier when the at least one peaking amplifier does not operate.

2. The apparatus of claim 1, wherein an impedance at a node at which outputs of the carrier amplifier and the at least one peaking amplifier are coupled is less than $R_0/N$,
    wherein the '$R_0$' represents an output load impedance of the Doherty amplifier, and the 'N' represents a total count of the carrier amplifier and the at least one peaking amplifier.

3. The apparatus of claim 2, wherein the Doherty circuit comprises a quarter-wave (λ/4) transmission line connecting to the node at which the outputs of the carrier amplifier and the at least one peaking amplifier are coupled, and
    wherein the characteristic impedance of the quarter-wave transmission line is less than $$\sqrt{\frac{1}{N}R_0}.$$

4. The apparatus of claim 2, wherein the Doherty circuit comprises a quarter-wave transmission line configured to perform the role of an impedance inverter.

5. The apparatus of claim 2, wherein the Doherty circuit comprises one of a microstrip line and a lumped component connecting to the node at which the outputs of the carrier amplifier and the at least one peaking amplifier are coupled.

6. The apparatus of claim 1, wherein each of the carrier amplifier and the at least one peaking amplifier comprise a transistor of the same size.

7. The apparatus of claim 1, further comprising:
    matching circuits configured to input match and output match of the carrier amplifier; and
    matching circuits configured to input match and output match each of the at least one peaking amplifier.

8. The apparatus of claim 1, wherein a Direct Current (DC) bias applied to the carrier amplifier is larger than a DC bias applied to the at least one peaking amplifier.

9. An operation method of a Doherty amplifier, the method comprising:
    providing a power signal to each of a carrier amplifier and at least one peaking amplifier;
    when the at least one peaking amplifier does not operate, generating at a Doherty circuit a load impedance of the carrier amplifier that is larger than twice a load impedance at a maximum output power of the carrier amplifier; and
    amplifying power of a signal inputted from a power divider through the carrier amplifier.

10. The method of claim 9, wherein an impedance at a node at which outputs of the carrier amplifier and the at least one peaking amplifier are coupled is less than $R_0/N$,
    wherein the '$R_0$' represents an output load impedance of the Doherty amplifier, and the 'N' represents a total count: of the carrier amplifier and the at least one peaking amplifier.

11. The method of claim 10, further comprising connecting a quarter-wave (λ/4) transmission line to the node at which the outputs of the carrier amplifier and the at least one peaking amplifier are coupled, and
    wherein the characteristic impedance of the quarter-wave transmission line is less than $$\sqrt{\frac{1}{N}R_0}.$$

12. The method of claim 10, wherein the Doherty circuit comprises a quarter-wave transmission line performing the role of an impedance inverter.

13. The method of claim 10, further comprising connecting one of a microstrip line and a lumped component to the node at which the output ways of the carrier amplifier and the at least one peaking amplifier are coupled.

14. The method of claim 9, further comprising using a same size transistor in each of the carrier amplifier and the at least one peaking amplifier.

15. The method of claim 9, further comprising:
    input matching and output matching the carrier amplifier; and
    input matching and output matching each of the at least one peaking amplifier.

16. The method of claim 9, further comprising applying a first Direct Current (DC) bias to the carrier amplifier and a second DC bias to the at least one peaking amplifier, the first DC bias greater than the second DC bias.

17. An apparatus comprising:
    a power divider configured to divide an input signal to a plurality of power signals;
    a carrier amplifier configured to amplify one of the plurality of power signals from the power divider;
    at least one peaking amplifier, each peaking amplifier configured to amplify one of the remaining power signals from the power divider, a number of the plurality of power signals corresponding to the total count of the carrier amplifier and the at least one peaking amplifier;

a plurality of offset lines configured to allow load modulation, a first of the plurality of offset lines coupled to an output of the carrier amplifier, each of the remaining offset lines coupled to an output of an output of a corresponding peaking amplifier; and a Doherty circuit configured to generate a load impedance of the carrier amplifier that is larger than twice a load impedance at a maximum output power of the carrier amplifier when the at least one peaking amplifier does not operate.

18. The apparatus of claim 17, wherein the Doherty circuit comprises a first quarter-wave transmission line comprising a first end and a second end and configured to inversely change a load impedance output, the first end coupled to an output of the first of the plurality of offset lines and the second end coupled to the outputs of the remaining offset lines.

19. The apparatus of claim 18, wherein the Doherty circuit comprises a second quarter-wave transmission line comprising a first end coupled to the outputs of the remaining offset lines and a second end coupled to an output of the apparatus.

20. The apparatus of claim 17, wherein a Direct Current (DC) bias applied to the carrier amplifier is larger than a DC bias applied to the at least one peaking amplifier.

* * * * *